(12) United States Patent
Ou et al.

(10) Patent No.: US 12,573,468 B2
(45) Date of Patent: Mar. 10, 2026

(54) MEMORY DEVICE WITH DUAL INTERFACE, TEST METHOD AND TEST SYSTEM THEREOF

(71) Applicant: SILICON MOTION, INC., Zhubei City (TW)

(72) Inventors: Hsu-Ping Ou, Zhubei City (TW); Chun-Ho Tung, Zhubei City (TW)

(73) Assignee: SILICON MOTION, INC., Zhubei City (TW)

( * ) Notice: Subject to any disclaimer, the term of this patent is extended or adjusted under 35 U.S.C. 154(b) by 320 days.

(21) Appl. No.: 18/511,992

(22) Filed: Nov. 16, 2023

(65) Prior Publication Data

US 2024/0296900 A1 Sep. 5, 2024

(30) Foreign Application Priority Data

Mar. 1, 2023 (TW) .................................. 112107390

(51) Int. Cl.
*G11C 29/50* (2006.01)
*G06F 11/3668* (2025.01)
*G06K 19/077* (2006.01)

(52) U.S. Cl.
CPC .... *G11C 29/50004* (2013.01); *G06F 11/3692* (2013.01); *G06K 19/07732* (2013.01); *G11C 29/50* (2013.01); *G11C 2029/5004* (2013.01)

(58) Field of Classification Search
CPC ... G11C 29/50004; G11C 29/56; G11C 29/50; G11C 2029/5004; G06F 11/3692; G06K 19/07732
See application file for complete search history.

(56) References Cited

FOREIGN PATENT DOCUMENTS

| | | |
|---|---|---|
| CN | 102902489 A | 1/2013 |
| JP | 2003317054 A | 11/2003 |
| TW | 200402724 A | 2/2004 |
| TW | I603324 B | 10/2017 |

*Primary Examiner* — Mark D Featherstone
*Assistant Examiner* — Rong Tang

(57) ABSTRACT

Disclosed is a memory device with dual interface, test method and test system thereof. An initialization procedure is executed by the memory device with dual interface in a PCIe mode. A voltage level of a pin of the memory device with dual interface is altered according to the initialization procedure, wherein the pin of the memory device with dual interface operates in a SD mode but not in PCIe mode. The voltage level of the pin of the memory device with dual interface is switched between a high voltage level and a low voltage level at a first frequency during a test stage of the initialization procedure. The voltage level of the pin of the memory device with dual interface is kept at the high voltage level or the low voltage level during a result display stage of the initialization procedure.

20 Claims, 5 Drawing Sheets

MEMORY DEVICE WITH DUAL INTERFACE, TEST METHOD AND TEST SYSTEM THEREOF

CROSS REFERENCE TO RELATED APPLICATION

This application claims the priority benefit of Taiwanese Patent Application Serial Number 112107390, filed on Mar. 1, 2023, the full disclosure of which is incorporated herein by reference.

BACKGROUND

Technical Field

The present disclosure relates to the technical field of memory device, particularly to a memory device with dual interface, a test method and a test system thereof.

Related Art

As the demand for massive digital audio-visual access increases greatly, the demand for access speed of the memory device also increases thereupon. Therefore, a high-speed memory device is proposed to provide faster access speed of memory device. The high-speed memory device retains inherent SD communication mode and can be applied to existing access equipment. Moreover, the high-speed memory device is equipped with a PCIe communication mode, so it can perform high-speed data access with external devices through the PCIe communication mode for providing faster data access speed.

However, existed test systems and test methods for memory device cannot be directly applied to the high-speed memory devices. Thus, the construction of a complex test system that is satisfy the hardware specification of the high-speed memory device to complete the test of high-speed memory devices is needed, which makes the test of high-speed memory devices inconvenient. Therefore, how to provide a test system and a test method that is simple and suitable for high-speed memory devices is the goal of relevant industry.

SUMMARY

The embodiments of the present disclosure provide a memory device with dual interface, a test method and a test system thereof, which are applicable to the mentioned high-speed memory device. The memory device with dual interface, the test method and the test system are easily to construct and complete for the required tests of high-speed memory devices. Therefore, the convenience of the test of the high-speed memory devices is improved.

In one embodiment of the present disclosure, a test method for memory device with dual interface is provided. The test method comprises the steps of executing an initialization procedure in a PCIe mode for a memory device with dual interface and altering a voltage of a pin that operating in an SD mode of the memory device with dual interface based on the initialization procedure. Wherein, the voltage level of the pin of the memory device with dual interface is switched between a high voltage level and a low voltage level at a first frequency during a test stage of the initialization procedure, the voltage level of the pin of the memory device with dual interface is maintained at the high voltage level or the low voltage level according to a first test result during a result display stage of the initialization procedure and a timing of the test stage of the initialization procedure precedes a timing of the result display stage of the initialization procedure.

In one embodiment of the present disclosure, a memory device with dual interface is provided. The memory device with dual interface comprises a flash memory module storing an initialization program and a main control module electrically connected to the flash memory module and configured to access the initialization program to execute an initialization procedure. The main control module is configured to execute the initialization procedure in a PCIe mode for the memory device with dual interface and altering a voltage of a pin that operating in an SD mode of the memory device with dual interface based on the initialization procedure. Wherein, the voltage level of the pin of the memory device with dual interface is switched between a high voltage level and a low voltage level at a first frequency during a test stage of the initialization procedure, the voltage level of the pin of the memory device with dual interface is maintained at the high voltage level or the low voltage level according to a first test result during a result display stage of the initialization procedure, and a timing of the test stage of the initialization procedure precedes a timing of the result display stage of the initialization procedure.

In one embodiment of the present disclosure, a test system for a memory device with dual interface is provided. The test system comprises a host communicating with a memory device with dual interface in a PCIe mode and a status display circuit communicating with a pin of the memory device with dual interface for displaying a test stage or a result display stage of the memory device with dual interface. The memory device with dual interface comprises a flash memory module storing an initialization program and a main control module electrically connected to the flash memory module and configured to access the initialization program to execute an initialization procedure. The main control module is configured to execute the initialization procedure in the PCIe mode for the memory device with dual interface and altering a voltage of the pin that operating in an SD mode of the memory device with dual interface based on the initialization procedure. Wherein, the voltage level of the pin of the memory device with dual interface is switched between a high voltage level and a low voltage level at a first frequency during the test stage of the initialization procedure, the voltage level of the pin of the memory device with dual interface is maintained at the high voltage level or the low voltage level according to a first test result during the result display stage of the initialization procedure, and a timing of the test stage of the initialization procedure precedes a timing of the result display stage of the initialization procedure.

In one embodiment of the present disclosure, a test method for a memory device with dual interface is provided. The test method comprises the steps of executing an initialization procedure with a first interface and altering the voltage of a pin of a second interface based on the initialization procedure. The voltage level of the pin of the second interface is switched between a high voltage level and a low voltage level at a first frequency during a test stage of the initialization procedure.

In one embodiment of the present disclosure, a test system for a memory device with dual interface is provided. The test system comprises a host, a light-emitting diode, a flash memory module stored an initialization program and a main control module electrically connected to the flash memory module and configured to access the initialization program to execute an initialization procedure. The main control module communicates with the host through a first interface and is electrically connected with the light-emitting diode through a second interface. The light-emitting diode flickers at a first frequency by a voltage of a pin of the second interface altered by the main control module during a test stage of the initialization procedure.

It should be understood, however, that this summary may not contain all aspects and embodiments of the present invention, that this summary is not meant to be limiting or restrictive in any manner, and that the invention as disclosed herein will be understood by one of ordinary skill in the art to encompass obvious improvements and modifications thereto.

BRIEF DESCRIPTION OF THE DRAWINGS

The features of the exemplary embodiments believed to be novel and the elements and/or the steps characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

DETAILED DESCRIPTION OF THE EMBODIMENTS

Figure 1:
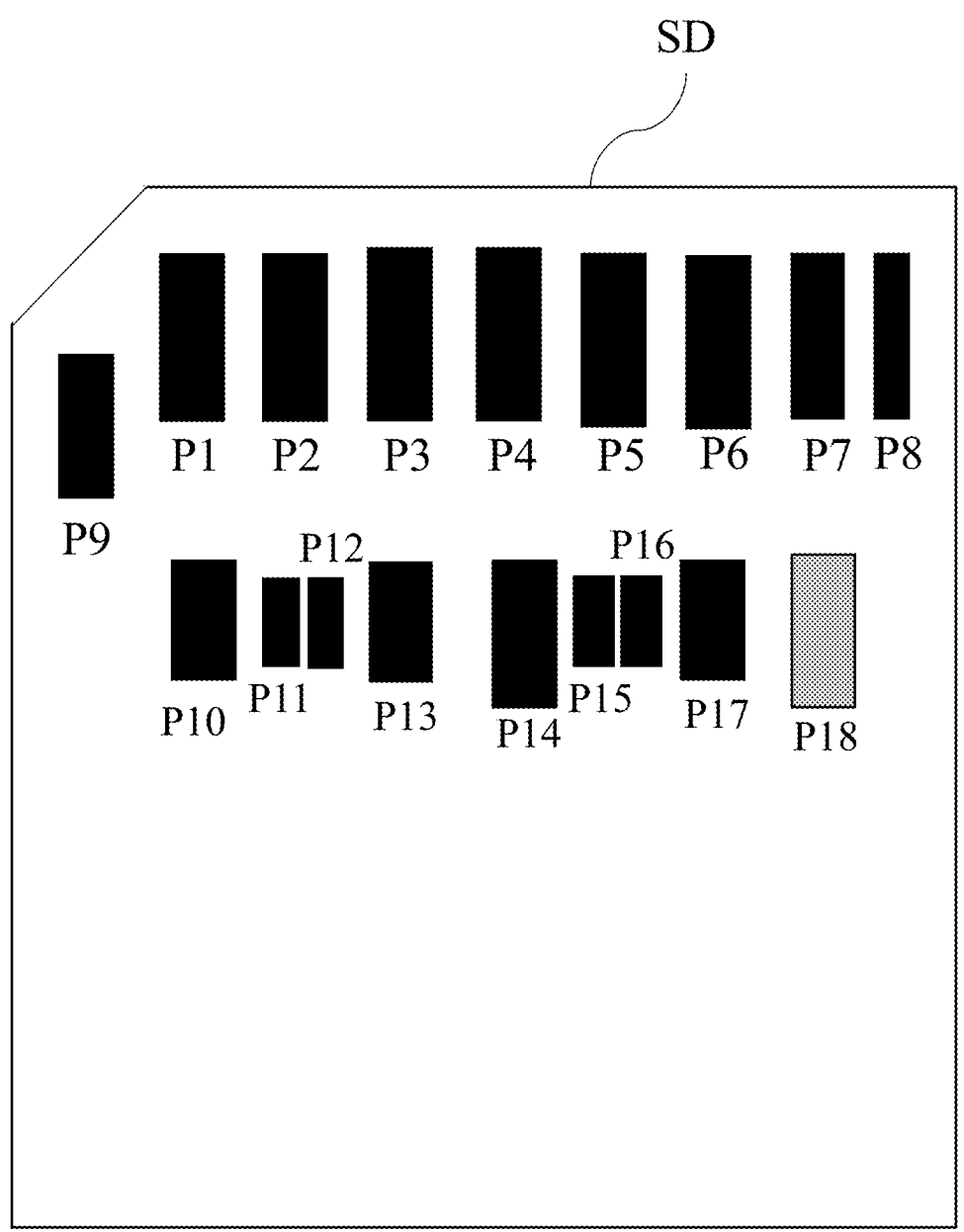
FIG. 1 is a schematic diagram of a memory device with dual interface.

The present invention will now be described more fully hereinafter with reference to the accompanying drawings, in which exemplary embodiments of the invention are shown. This present invention may, however, be embodied in many different forms and should not be construed as limited to the embodiments set forth herein. Rather, these embodiments are provided so that this present invention will be thorough and complete, and will fully convey the scope of the present invention to those skilled in the art.

Certain terms are used throughout the description and following claims to refer to particular components. As one skilled in the art will appreciate, manufacturers may refer to a component by different names. This document does not intend to distinguish between components that differ in name but function. In the following description and in the claims, the terms "include/including" and "comprise/comprising" are used in an open-ended fashion, and thus should be interpreted as "including but not limited to". "Substantial/substantially" means, within an acceptable error range, the person skilled in the art may solve the technical problem in a certain error range to achieve the basic technical effect.

The following description is of the best-contemplated mode of carrying out the invention. This description is made for the purpose of illustration of the general principles of the invention and should not be taken in a limiting sense. The scope of the invention is best determined by reference to the appended claims.

Moreover, the terms "include", "contain", and any variation thereof are intended to cover a non-exclusive inclusion. Therefore, a process, method, object, or device that comprises a series of elements not only include these elements, but also comprises other elements not specified expressly, or may include inherent elements of the process, method, object, or device. If no more limitations are made, an element limited by "include a/an . . ." does not exclude other same elements existing in the process, the method, the article, or the device which comprises the element.

In the following embodiment, the same reference numerals are used to refer to the same or similar elements throughout the invention.

Please refer to FIG. 1, which is a schematic diagram of an embodiment of a memory device with dual interface. In this embodiment, the memory device with dual interface is a secure digital card SD, which includes at least eighteen pins, such as pins P1 to P18. The secure digital card SD is configured to use the pins P1 to P9 of a SD interface for data access when the secure digital card SD is operating in an SD mode that is a communication mode for accessing data in accordance with the SD standard specification. The secure digital card SD is configured to use the pins P1, P4, P7 to P18 of a PCIe interface for data access when the secure digital card SD is operating in an PCIe mode that is a communication mode for accessing data in accordance with the PCIe standard specification. Therefore, different data transmission modes and data transmission speeds according to the needs of users are provided by the secure digital card SD to provide better user experience.

In this embodiment, the secure digital card SD is a secure digital card with the SD 7.0/SD Express standard.

Figure 2:
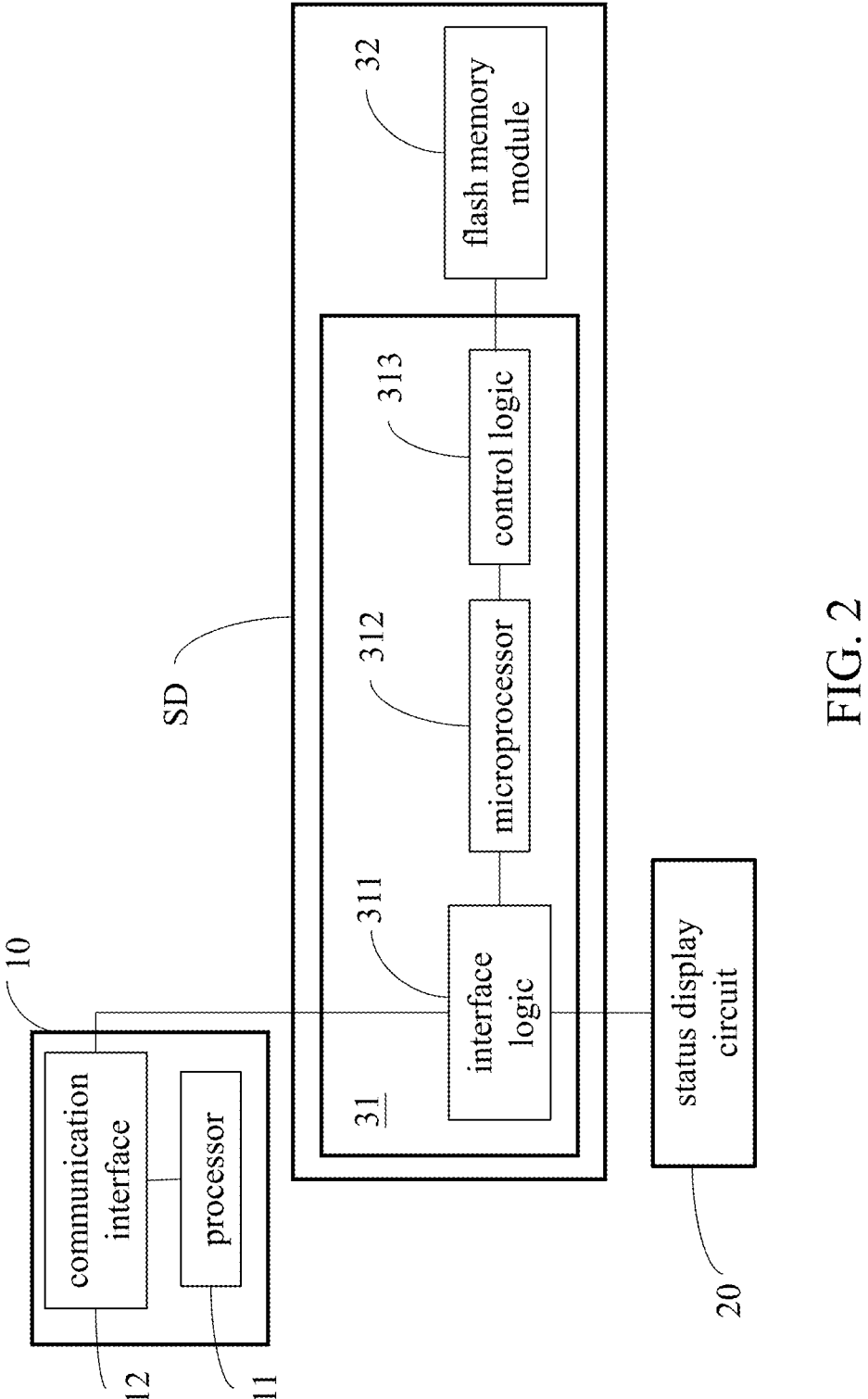
FIG. 2 is a schematic diagram of a test system for the memory device with dual interface in an embodiment of the present disclosure.

Please refer to FIG. 1 and FIG. 2, FIG. 2 is a test system for secure digital card according to an embodiment of the present disclosure. The test system includes a host 10, a status display circuit 20 and a secure digital card SD. The host 10 is communicatively connected to the PCIe interface of the secure digital card SD, and the status display circuit 20 is communicatively connected to the SD interface of the secure digital card SD.

In one embodiment, the status display circuit 20 is communicatively connected to one of the pins P2, P3, P5 or P6 of the SD interface. That is, the status display circuit 20 is communicatively connected to the pin that operates in the SD mode but not operates in the PCIe mode.

The host 10 comprises a processor 11 and a communication interface 12. The communication interface 12 is communicatively connected to the pins P1 to P18 of the secure digital card SD and performs data access with the secure digital card SD through an SD standard protocol or a PCIe standard protocol. The processor 11 of the host 10 is configured to execute an initializer program for the secure digital card SD, so that the secure digital card SD correspondingly executes an initialization procedure in the PCIe mode.

In one embodiment, the host 10 can be implemented by a notebook, a tablet, or a desktop computer, and the present disclosure is not limited thereto.

Figure 3:
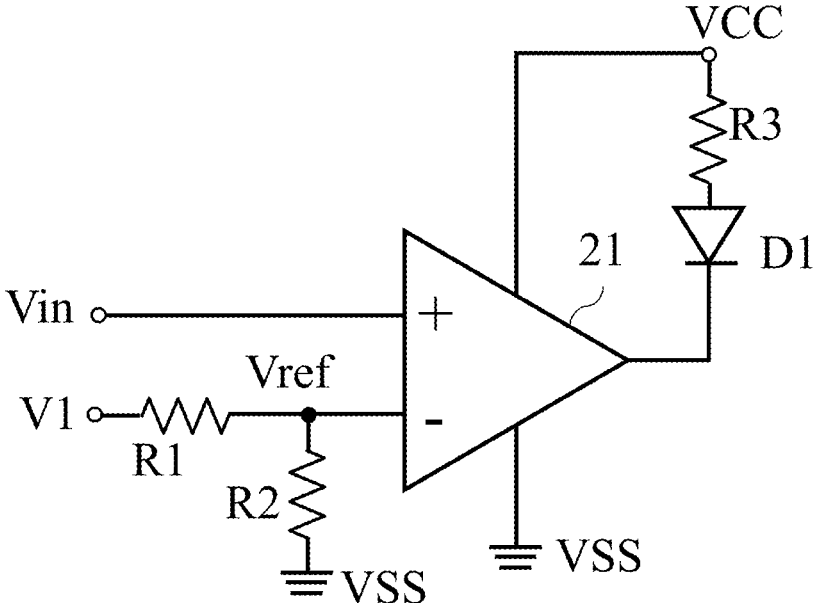
FIG. 3 is a schematic diagram of a status display circuit in an embodiment of the present disclosure.

Please refer to FIG. 3, which is a schematic diagram of a status display circuit 20 according to an embodiment of the present disclosure. In this embodiment, the status display circuit 20 can be implemented as a comparator circuit, and the present disclosure is not limited thereto. The status display circuit 20 comprises a comparator 21, resistors R1, R2, R3 and a light-emitting diode D1. A positive power supply end of the comparator 21 receives a driving voltage VCC, and a negative power supply end of the comparator 21 receives a ground voltage VSS. A positive input terminal of the comparator 21 is communicatively connected to a pin of the SD interface of the secure digital card SD (such as pin P2, P3, P5 or P6). A negative input terminal of the comparator 21 is electrically connected to the resistors R1 and R2. The positive input terminal of the comparator 21 is configured to receive the voltage of the pin communicatively connected with the comparator 21 (ie, the voltage Vin shown in FIG. 3). One end of the resistor R1 receives a first voltage V1, and the other end of the resistor R1 is electrically connected to the negative input terminal of the comparator 21. One end of the resistor R2 is electrically connected to the negative input terminal of the comparator 21, and the other end of the resistor R2 is grounded. For example, the other end of the resistor R2 receives the ground voltage VSS. Therefore, a voltage Vref at the negative input terminal of the comparator 21 is determined by the voltage division between the resistors R1 and R2. An output terminal of the comparator 21 is electrically connected to the light-emitting diode D1. One end of the light-emitting diode D1 is electrically connected to the resistor R3, and the other end of the light-emitting diode D1 is electrically connected to the output terminal of the comparator 21. One end of the resistor R3 receives the driving voltage VCC, and the other end of the resistor R3 is electrically connected to the one end of the light-emitting diode D1.

In this embodiment, the comparator 21 compares the voltage of the positive input terminal (the voltage of the pin of the secure digital card SD) and the voltage of the negative input terminal. When the voltage Vin at the positive input terminal is greater than the voltage Vref at the negative input terminal, the voltage at the output terminal of the comparator 21 is equal to a high voltage, such as the driving voltage VCC. The light-emitting diode D1 does not conducted due to the voltage of the one end of the light-emitting diode D1 smaller than the voltage of the other end of the light-emitting diode D1. Thus, the light-emitting diode D1 is turned off. When the voltage Vin at the positive input terminal is smaller than the voltage Vref at the negative input terminal, the voltage at the output terminal of the comparator 21 is equal to a low voltage, such as the ground voltage VSS. The light-emitting diode D1 does conducted due to the voltage of the one end of the light-emitting diode D1 greater than the voltage of the other end of the light-emitting diode D1. Thus, the light-emitting diode D1 is turned on. Therefore, the status display circuit 20 of the present disclosure can correspondingly display the test status and result of the secure digital card SD in real time.

Please refer to FIG. 2 again, the secure digital card SD comprises a main control module 31 and a flash memory module 32. The main control module 31 comprises an interface logic 311, a microprocessor 312 and a control logic 313, and the microprocessor 312 is electrically connected to the interface logic 311 and the control logic 313. The microprocessor 312 is configured to execute the program code required for the operation of the secure digital card SD to communicate with the host 10 through the aforementioned pins P1 to P18 by the interface logic 311 and execute an access operation of the flash memory module 32 through the control logic 313. The flash memory module 32 includes a plurality of blocks for storing data, each block includes a plurality of pages, and each page includes a plurality of bits.

In one embodiment, the flash memory module 32 is a NAND flash memory, and the present disclosure is not limited thereto.

In this embodiment, during a power-on initialization stage, the microprocessor 312 is configured to access the initialization program to execute the initialization procedure. During a test stage of the initialization program, the microprocessor 312 performs access tests on the blocks in the flash memory module 32 and generates test results corresponding to the status of the blocks. For example: perform write operation and read operation after erasing operation to identify the status of the blocks (i.e. determine whether the blocks are an available block or a bad block). In a result display stage of the initialization procedure, the voltage state of a pin (eg, pin P2, P3, P5 or P6) of the SD interface of the secure digital card SD is correlated with the test results by the microprocessor 312. Wherein, a timing of the test stage of the initialization procedure precedes a timing of the result display stage of the initialization procedure.

More specifically, the microprocessor 312 is configured to enabling or disabling a voltage control element for a pin (pin P2, P3, P5 or P6) of the SD interface of the secure digital card SD to alter the voltage of the pin. For example, the voltage control element is a pull-up resistor or a pull-down resistor for the pin. Therefore, the voltage of the pin is pulled up to a high voltage level according to the pull-up resistor enabled by the microprocessor 312, or the voltage of the pin is pull down to a low voltage level according to the pull-down resistor enable by the microprocessor 312.

In the present embodiment, the voltage of the pin of the SD interface is switched between the high voltage level and the low voltage level at a first frequency during the test stage of the initialization procedure. Therefore, the light-emitting diode D1 in the status display circuit 20 flickers at the first frequency during the test stage to indicate that a test is executed.

In one embodiment, the voltage of the pin is maintained at a low voltage level by the microprocessor 312 according to the test result generated at the end of the test stage when the test result indicates that a number of available blocks of the secure digital card SD is greater than or equal to a first threshold. The light-emitting diode D1 is continuously turned on, which means that the test of the secure digital card SD has passed and the secure digital card SD has sufficient the needed storage capacity as a first-class product. In this way, it can be quickly identify whether the secure digital card SD is a secure digital card with sufficient storage capacity by the state of the light-emitting diode D1. The convenience of testing the secure digital card is improved.

When the test result indicates that the number of available blocks of the secure digital card SD is between the first threshold and a second threshold, the voltage of the pin of the SD interface is altered by the microprocessor 312 according to the test result of the test stage to be maintained at the high voltage level for a period of time after to be maintained at the low voltage level for the period of time. That is, the voltage of the pin is dynamically switched between the high voltage level and the low voltage level at a second frequency, so that the light-emitting diode D1 alternates between a bright state (turn on) and a dark state (turn off) with the period of time, which means that the test of the secure digital card SD has passed and the secure digital card SD does not sufficient the needed storage capacity. The secure digital card SD is determined as a second-class product. Wherein, the second threshold is smaller than the first threshold.

When the test result indicates that the number of available blocks of the SD card is less than the second threshold, the voltage of the SD interface pin is maintained at a high voltage level by the microprocessor 312. The light-emitting diode D1 is maintained in the dark state, which means that its storage capacity is seriously insufficient, and it has failed the test and cannot be regarded as a qualified product.

With the above-mentioned embodiment, by identifying the state of the light-emitting diode D1 (for example, identify the length of time it remains on) can quickly identify whether the secure digital card SD is available and its size of available storage capacity (the number of available blocks). The convenience of testing the secure digital card is improved.

In one embodiment, the microprocessor 312 stores individual test results of each of the blocks in a block test result table to record the test results of each blocks.

In one embodiment, the initialization program and the block test result table are stored in the flash memory module 32.

Therefore, with the test system of the embodiment of the present disclosure, the secure digital card SD is configured by the host 10 to be powered on and executing in the PCIe mode for executing the initialization procedure when the initialization procedure is going to be executed. During the test stage of the initialization procedure, the voltage of the pin of the secure digital card SD communicatively connected to the status display circuit 20 is dynamically switched between the high voltage level and the low voltage level. So the light emitting diode D1 of the status display circuit 20 flicked accordingly to indicate that the secure digital card SD is in the test stage. During the result display stage of the initialization procedure, the voltage of the pin of the secure digital card SD commutatively connected to the status display circuit 20 is maintained at the high voltage level or the low voltage level corresponding to the test results of the blocks to indicate the test result of the Secure Digital Card SD.

Therefore, the secure digital card SD disclosed in the present disclosure can control the voltage of pins based on the test result of the initialization procedure when the initialization procedure is executed. The status of the secure digital card SD (test stage, test result etc.) can be quickly determined by the operation of the light-emitting diode D1. Meanwhile, since only the state the light-emitting diode D1 needs to be determined, the status display circuit 20 does not need to be composed of complex control circuits, which greatly reduces the complexity of the test system and improves the convenience of the test of the secure digital card SD.

Figure 4:
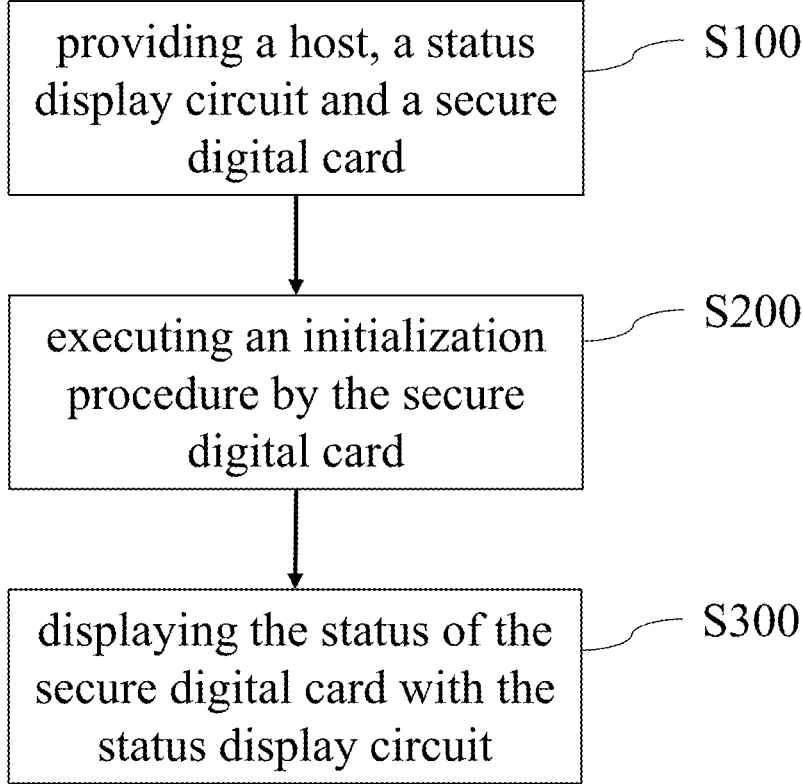
FIG. 4 is a schematic diagram of a test method for the memory device with dual interface in an embodiment of the present disclosure.

Please refer to FIG. 4. FIG. 4 is a schematic diagram of a test method for a secure digital card according to an embodiment of the present disclosure, which includes steps S100-S300.

In step S100, providing a host, a status display circuit and a secure digital card. Please refer to FIG. 2 at the same time. In this step, the host 10 is communicated with the secure digital card SD in PCIe mode, and the status display circuit 20 is communicatively connected to a pin of the secure digital card SD. Wherein, the pin communicatively connected to the status display circuit 20 is configured to operate in SD mode and not operate in PCIe mode.

In step S200, executing an initialization procedure by the secure digital card. In this step, the secure digital card SD is power on and initialized by the host 10, and the microprocessor 312 of the secure digital card SD accesses and executes an initialization program to perform the initialization procedure. During a test stage of the initialization procedure, the microprocessor 312 performs access tests on the blocks in the flash memory module 32 to identify the states of the blocks and generate test results corresponding to the states of each of the blocks. In a result display stage of the initialization procedure, the voltage of the pin of the secure digital card SD communicatively connected to the state display circuit 20 is correlated with the test result of the secure digital card SD.

In step S300, displaying the status of the secure digital card with the status display circuit. In this step, while the secure digital card SD is executing the initialization procedure, the light-emitting diode D1 of the status display circuit 20 displays (flicks, always turn on or always turn off) corresponding to the voltage of the pin of the secure digital card SD. Thereby, the test result of the secure digital card SD can be quickly and accurately obtained through the state of the light-emitting diode D1.

Figure 5:
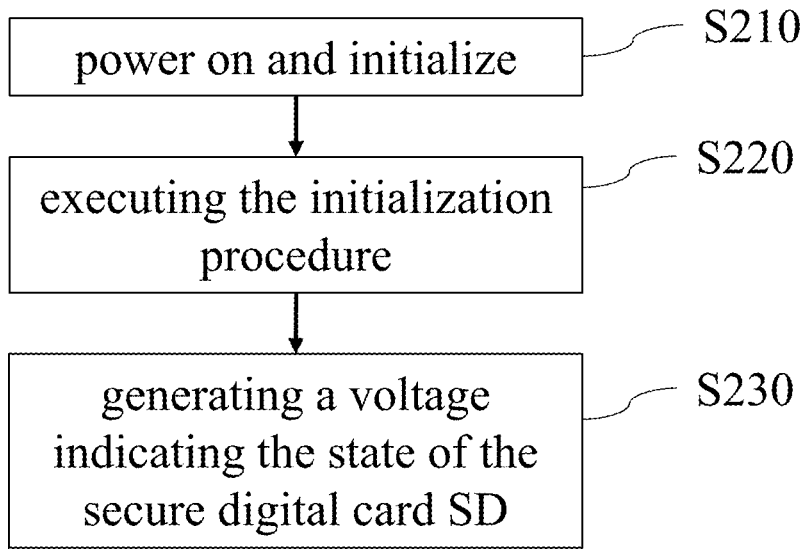
FIG. 5 is another schematic diagram of the test method for the memory device with dual interface in the embodiment of the present disclosure.

As shown in FIG. 5, step S200 further includes the following steps.

In step S210, power on and initialize. In this step, the secure digital card SD is powered on and initialized and communicates with host 10 in PCIe mode.

In step S220, executing the initialization procedure. In this step, the microprocessor 312 access the initialization program stored in the flash memory module 32 and executes the corresponding initialization procedure. During the test stage of initialization procedure, the secure digital card SD executes an access test to the blocks in the flash memory module 32 to distinguish the states of each of the blocks (available block or bad block) and generates a test result of the secure digital card SD corresponding to the states of the blocks.

In step S230, generating a voltage indicating the state of the secure digital card SD. During the test stage of the initialization procedure, the secure digital card SD dynamically switches the voltage of the pin communicatively connected to the status display circuit 20 between a high voltage level and a low voltage level. In the result display stage of the initialization procedure, according to the test result of the test stage, the voltage of the pin is maintained at one of the high voltage level and the low voltage level.

In one embodiment, in the result display stage, after the voltage of the pin is maintained at one of the high voltage level and the low voltage level for a first period of time, the voltage of the pin is maintained at the other of the high voltage level and the low voltage level for a second period of time. The first period of time and the second period of time may be the same or different, and the present disclosure is not limited thereto.

In one embodiment, a voltage control element for the pin of the secure digital card SD connected to the status display circuit 20 is enabled or disabled to alter the voltage of the pin.

In one embodiment, during the test stage, a block test result table representing the test results of each blocks of the flash memory module 32 is established and stored by the secure digital card SD.

In summary, since the memory device with dual interface of the embodiment of the present disclosure is configured to control the voltage of a pin according to the test result of the initialization procedure when executing the initialization procedure, the status of the memory device with dual interface can be quickly confirmed by the state of a light-emitting diode D1. Meanwhile, since only the state of the light-emitting diode D1 needs to be determined, the status display circuit does not need to be composed of complex control circuits, which greatly reduces the complexity of the test system and improves the convenience of the test of the memory device with dual interface.

It is to be understood that the term "comprises", "comprising", or any other variants thereof, is intended to encompass a non-exclusive inclusion, such that a process, method, article, or device of a series of elements not only include those elements but also comprises other elements that are not explicitly listed, or elements that are inherent to such a process, method, article, or device. An element defined by the phrase "comprising a . . . " does not exclude the presence of the same element in the process, method, article, or device that comprises the element.

Although the present invention has been explained in relation to its preferred embodiment, it does not intend to limit the present invention. It will be apparent to those skilled in the art having regard to this present invention that other modifications of the exemplary embodiments beyond those embodiments specifically described here may be made without departing from the spirit of the invention. Accordingly, such modifications are considered within the scope of the invention as limited solely by the appended claims.

What is claimed is:

1. A test method for memory device with dual interface, comprising:
  executing an initialization procedure in a PCIe mode for a memory device with dual interface; and
  altering a voltage of a pin operating in an SD mode of the memory device with dual interface based on the initialization procedure;
  wherein, the voltage level of the pin of the memory device with dual interface is switched between a high voltage level and a low voltage level at a first frequency during a test stage of the initialization procedure and the voltage level of the pin of the memory device with dual interface is maintained at the high voltage level or the low voltage level according to a first test result during a result display stage of the initialization procedure; a timing of the test stage of the initialization procedure precedes a timing of the result display stage of the initialization procedure.

2. The test method according to claim 1, wherein the voltage of the pin is maintained at the low voltage level for another period after the voltage of the pin is maintained at the high voltage level for a period according to a second test result during the result display stage.

3. The test method according to claim 1, wherein the step of altering a voltage of a pin operating in an SD mode of the memory device with dual interface based on the initialization procedure comprises:
  enabling or disabling a voltage control element for the pin of the memory device with dual interface to alter the voltage of the pin of the memory device with dual interface.

4. The test method according to claim 1, wherein a block test result table representing the test result of each of blocks is established and stored by the memory device with dual interface during the test stage of the initialization procedure.

5. The test method according to claim 1, further comprising:
  providing a host communicating with the memory device with dual interface in the PCIe mode and a status display circuit communicating with the pin of the memory device with dual interface; and
  displaying a voltage state of the pin of the memory device with dual interface by the status display circuit.

6. A memory device with dual interface, comprising:
  a flash memory module stored an initialization program; and
  a main control module electrically connected to the flash memory module and configured to access the initialization program to execute an initialization procedure, wherein the main control module is configured to:
    executing the initialization procedure in a PCIe mode for the memory device with dual interface; and
    altering a voltage of a pin operating in an SD mode of the memory device with dual interface based on the initialization procedure;
    wherein, the voltage level of the pin of the memory device with dual interface is switched between a high voltage level and a low voltage level at a first frequency during a test stage of the initialization procedure and the voltage level of the pin of the memory device with dual interface is maintained at the high voltage level or the low voltage level according to a first test result during a result display stage of the initialization procedure; a timing of the test stage of the initialization procedure precedes a timing of the result display stage of the initialization procedure.

7. The memory device with dual interface according to claim 6, wherein the voltage of the pin is maintained at the low voltage level for another period after the voltage of the pin is maintained at the high voltage level for a period by the main control module according to a second test result during the result display stage.

8. The memory device with dual interface according to claim 6, wherein a voltage control element for the pin of the memory device with dual interface is enabled or disabled by the main control module to alter the voltage of the pin of the memory device with dual interface.

9. The memory device with dual interface according to claim 6, wherein a block test result table representing a test result of each of blocks is established and stored by the memory device with dual interface during the test stage of the initialization procedure.

10. A test system for memory device with dual interface, comprising:
  a host, communicating with a memory device with dual interface in a PCIe mode; and
  a status display circuit communicating with a pin of the memory device with dual interface for displaying a test stage or a result display stage of the memory device with dual interface,
  wherein, the memory device with dual interface comprising:
    a flash memory module stored an initialization program; and
    a main control module electrically connected to the flash memory module and configured to access the initialization program to execute an initialization procedure, wherein the main control module is configured to:
      executing the initialization procedure in the PCIe mode for the memory device with dual interface; and
      altering a voltage of the pin operating in an SD mode of the memory device with dual interface based on the initialization procedure;
    wherein, the voltage level of the pin of the memory device with dual interface is switched between a high voltage level and a low voltage level at a first frequency during the test stage of the initialization procedure and the voltage level of the pin of the memory device with dual interface is maintained at the high voltage level or the low voltage level according to a first test result during the result display stage of the initialization procedure; a timing of the test stage of the initialization procedure precedes a timing of the result display stage of the initialization procedure.

11. A test method for memory device with dual interface, comprising:

executing an initialization procedure with a first interface; and altering the voltage of a pin of a second interface based on the initialization procedure;

wherein, the voltage level of the pin of the second interface is switched between a high voltage level and a low voltage level at a first frequency during a test stage of the initialization procedure.

12. The test method according to claim 11, wherein the first interface is a PCIe interface and the second interface is a SD interface.

13. The test method according to claim 11, wherein the first interface is a SD interface and the second interface is a PCIe interface.

14. The test method according to claim 11, wherein the voltage level of the pin of the second interface is maintained at the high voltage level or the low voltage level when a number of available blocks of the memory device with dual interface is equal to or greater than a first threshold during the result display stage of the initialization procedure.

15. The test method according to claim 14, wherein the voltage level of the pin of the second interface is switched between the high voltage level and the low voltage level at a second frequency when the number of available blocks of the memory device with dual interface is between the first threshold and a second threshold during the result display stage of the initialization procedure.

16. A test system for memory device with dual interface, comprising:

a host;

a light-emitting diode;

a flash memory module stored an initialization program; and a main control module electrically connected to the flash memory module and configured to access the initialization program to execute an initialization procedure, wherein the main control module communicates with the host through a first interface and is electrically connected with the light-emitting diode through a second interface, and wherein, the light-emitting diode flickers at a first frequency by a voltage of a pin of the second interface altered by the main control module during a test stage of the initialization procedure.

17. The test system for memory device with dual interface according to claim 16, wherein the main control module enables the light-emitting diode to continuously turn on or off according to a first test result during a result display stage of the initialization procedure.

18. The test system for memory device with dual interface according to claim 16, wherein the light-emitting diode flickers at a second frequency by the main control module according to a second test result during a result display stage of the initialization procedure.

19. The test system for memory device with dual interface according to claim 16, wherein the first interface is a PCIe interface and the second interface is a SD interface.

20. The test system for memory device with dual interface according to claim 16, wherein the first interface is a SD interface and the second interface is a PCIe interface.

* * * * *